United States Patent [19]

Kim et al.

[11] Patent Number: 5,543,649

[45] Date of Patent: Aug. 6, 1996

[54] ELECTROSTATIC DISCHARGE PROTECTION DEVICE FOR A SEMICONDUCTOR CIRCUIT

[75] Inventors: Tae-Han Kim, Suwon-City; Sang-Hoon Lee; Dae-Je Chin, both of Seoul, all of Rep. of Korea

[73] Assignee: Samsung Electronics Co., Ltd., Suwon City, Rep. of Korea

[21] Appl. No.: 396,142

[22] Filed: Mar. 1, 1995

[30] Foreign Application Priority Data

Mar. 2, 1994 [KR] Rep. of Korea ............ 3996/1994

[51] Int. Cl.⁶ .................................................. H01L 23/62
[52] U.S. Cl. ........................... 257/355; 257/356; 257/357
[58] Field of Search ................................. 257/355, 356, 257/357, 358, 359, 360, 361, 362, 363

[56] References Cited

U.S. PATENT DOCUMENTS 5,229,635  7/1993  Bessolo et al. ............ 257/357 X

FOREIGN PATENT DOCUMENTS 55-24489  2/1980  Japan ............................ 257/356
57-62564  4/1982  Japan ............................ 257/356

*Primary Examiner*—William Mintel
*Attorney, Agent, or Firm*—Cushman Darby & Cushman, L.L.P.

[57] ABSTRACT

The present invention provides an electrostatic discharge protection device of a semiconductor memory device which comprises a gate and a bulk region of first conduction type which are commonly connected to a first power supply, a first diffused region of second conduction type formed in the bulk region, isolated from the gate by a dielectric and connected to the second power supply, and a second diffused region of second conduction type separated from the first diffused region in the bulk region, isolated from the gate by the dielectric and connected to the signal voltage.

12 Claims, 4 Drawing Sheets

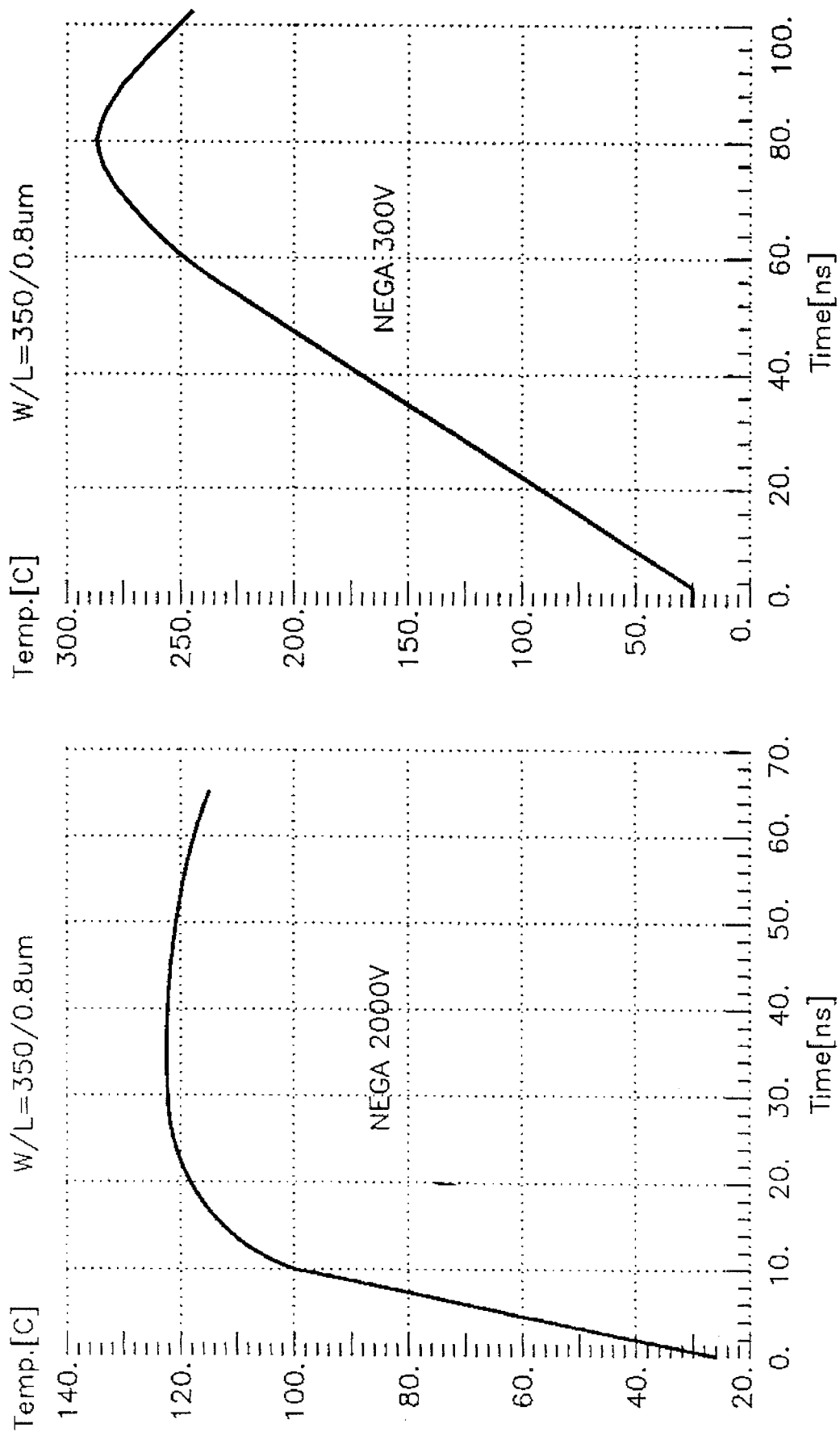

5,543,649

ELECTROSTATIC DISCHARGE PROTECTION DEVICE FOR A SEMICONDUCTOR CIRCUIT

BACKGROUND OF THE INVENTION

1. Field of the Invention

The present invention relates to an electrostatic discharge protection device for protecting externally generated semiconductor integrated circuit from a static electricity.

2. Description of the Related Arts

Static electricity is often externally generated, for example, from a human body or an assembling/transfer robot through a lead and the like, during the assembly of the semiconductor integrated circuit or the transfer of a packaged chip. If a large amount of charge due to static electricity is transferred to the chip, the gate oxide film of dielectric gate transistors formed within the chip can be ruptured by a high voltage, or the polysilicon and silicon substrates in gate electrodes can become fused to each other by heating. This results in degraded semiconductor integrated circuit performance. Therefore, semiconductor integrated circuits include devices which can protect against static electricity up to thousands of volts. The component performing such a function is referred to as an electrostatic discharge(ESD) protection device. A well known electrostatic protection device is disclosed in the U.S. Pat. No. 3,407,339 and is shown in FIG. 1.

Referring to FIG. 1, a conventional electrostatic discharge protection device uses a P-channel dielectric gate MOS transistor (hereinafter referred to as a "PMOS transistor") in which a gate 1 and a P+type source (or drain) 2 are coupled to an input voltage Vx, and a P+ type drain (or source) 3 to a substrate voltage Vss. As can be seen from FIG. 1(B), a PNP type parasitic bipolar transistor composed of P+ type diffused regions 2 and 3 and a bulk 4 (n type substrate or n type well) is also formed. The potential of the substrate voltage Vss is placed between a negative voltage and 0 volt, and the bulk 4 is coupled to the substrate voltage Vss or to the back gate voltage of another potential. That is, the conventional electrostatic discharge protection device as shown in FIG. 1 is featured in that the gate and source, or the gate and drain, are maintained at an equipotential. Thus, the protection device against the static electricity between the input voltage Vx and substrate voltage Vss utilizes a junction breakdown which occurs between the P+ diffused region 3 and n type substrate 4 (or n type well) in case of a static electricity being transferred into the substrate voltage Vss, and a P+/n junction diode formed between the P+ diffused region 2 and n type substrate 4 (or n type well) in case of the static electricity being transferred into the input voltage Vx.

However, the electrostatic discharge protection device as shown in FIG. 1 is disadvantageous in that it does not have electrostatic discharge protection functions between the input voltage Vx and power supply voltage Vcc and between the power supply voltage Vcc and substrate voltage Vss. If the construction as shown in FIG. 1 is formed between the power supply voltage Vcc and input voltage Vx and between the power supply voltage Vcc and substrate voltage Vss to proxide electrostatic discharge protection function for the power supply voltage Vcc, while such functions can be achieved, this results in increasing the size of the chip. Further, since semiconductor integrated circuits having a multi-power supply electrode such as a synchronous DRAM, a word augmented DRAM, a video RAM or a liquid crystal display, have various power supply pads, it is impossible to completely protect such a semiconductor integrated circuit using only the device shown in FIG. 1 from static electricity transferred into the chip externally. In addition, it is difficult to realize the complete protection function without increasing the size of the chip.

Referring to FIG. 1(B), when static electricity is transferred into the substrate voltage Vss, a backward biased junction is formed between the P+ type diffused region 2 and n type bulk 4, and high temperature is thereby concentrically generated in region 10 as indicated by a dashed line. If the temperature of a silicon single crystal exceeds 620° C., the polysilicon in the gate electrode 1, melts into the bulk and thus becomes fused with the bulk, which causes the gate electrode 1 and bulk 4 to be short-circuited.

SUMMARY OF THE INVENTION

It is therefore an object of the present invention to provide an electrostatic discharge protection device which is capable of completely protecting a chip from a static electricity transferred externally into the chip.

It is another object of the present invention to provide the electrostatic discharge protection device which is capable of completely protecting the chip from static electricity transferred externally into the chip without increasing the size of the chip.

To achieve the above objects, the present invention provides a semiconductor device having first and second power supplies and a signal voltage, which comprises a gate and a bulk region of first conduction type which are commonly connected to the first power supply, a first diffused region of second conduction type formed in the bulk region, isolated from the gate by a dielectric and connected to the second power supply, and a second diffused region of second conduction type separated from the first diffused region in the bulk region, isolated from the gate by the dielectric and connected to the signal voltage.

BRIEF DESCRIPTION OF THE DRAWINGS

In the detailed description of the preferred embodiments of the present invention presented below, reference is made to the accompanying drawings, in which:

FIG. 1 shows a conventional electrostatic discharge protection device, with

FIG. 4 shows the result of the test of the electrostatic discharge protection device according to the present invention, with FIG. 4(A) being a graph showing the result of the test on a human body model and FIG. 4(B) a graph showing the result of the test on a machine model.

DETAILED DESCRIPTION OF THE PREFERRED EMBODIMENT

Figure 1A:
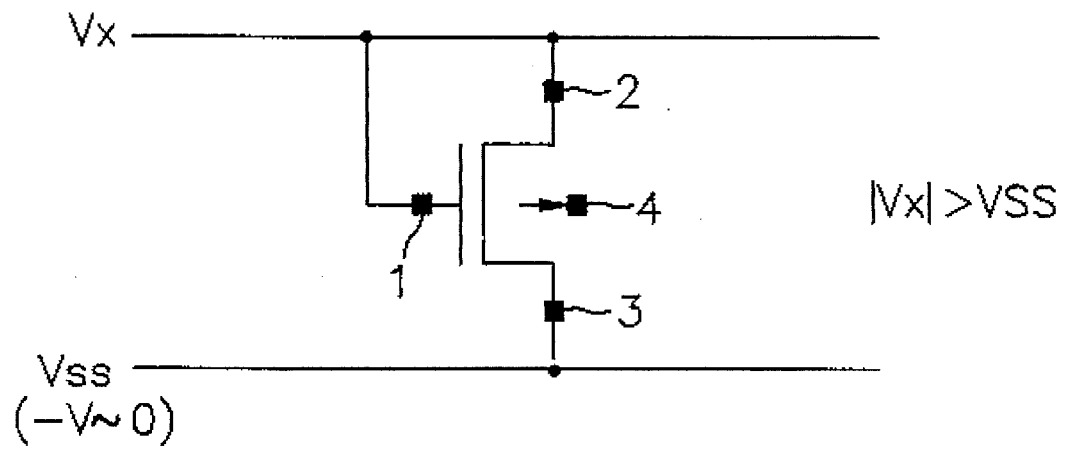
FIG. 1(A) showing an equivalent circuit diagram and FIG. 1(B) a vertical sectional diagram.
Figure 1B:
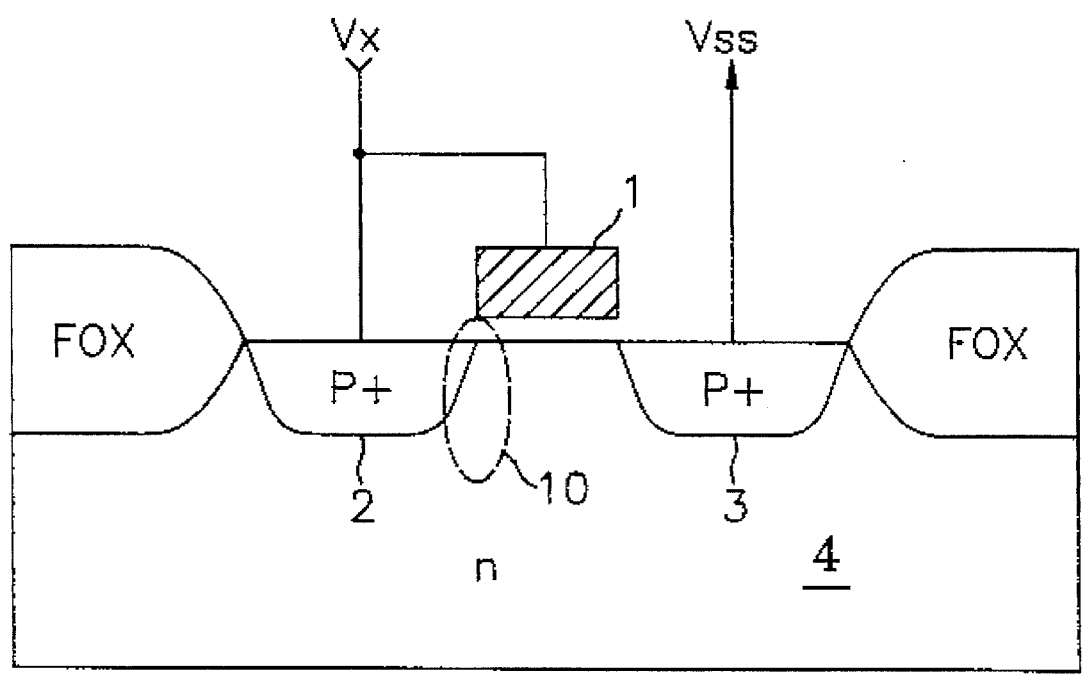
Figure 2A:
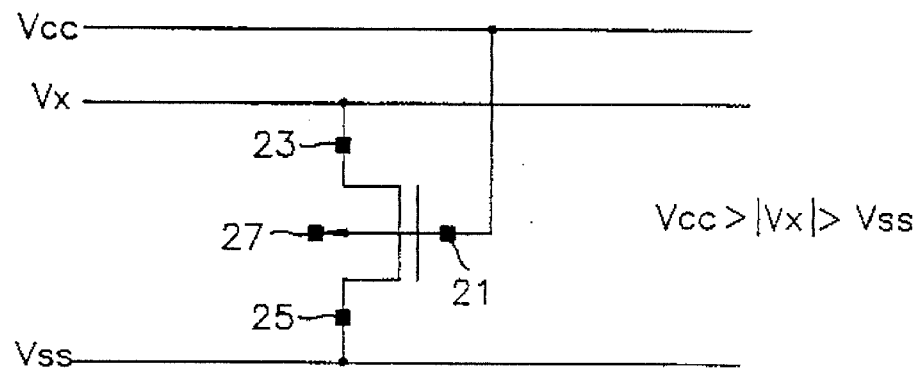
FIG. 2 shows the electrostatic discharge protection device according to a preferred embodiment of the present invention, with FIG. 2(A) showing the equivalent circuit diagram and FIG. 2(B) the vertical sectional diagram.
Figure 2B:
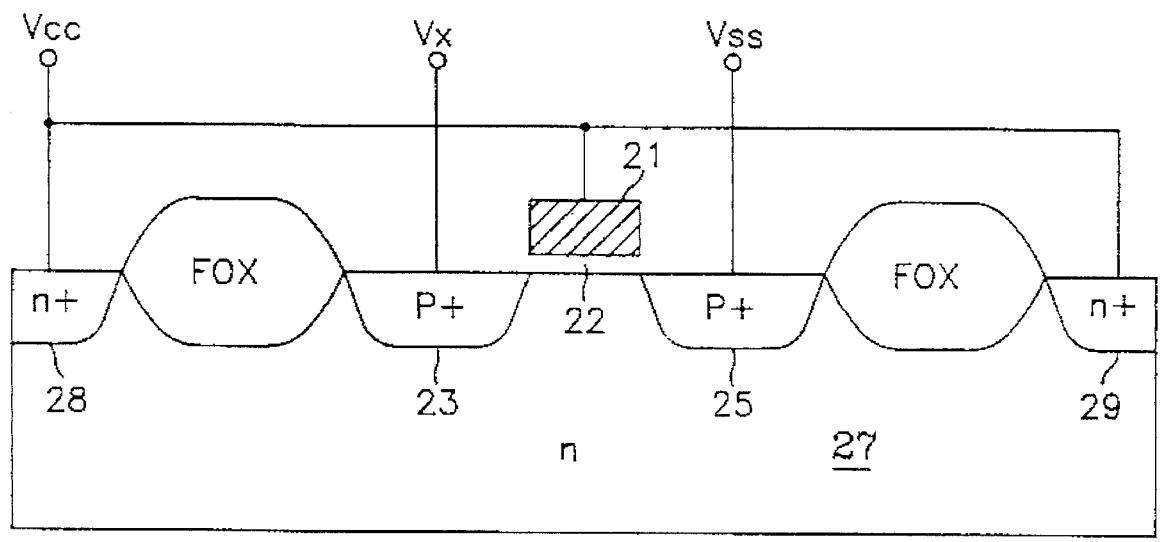
Figure 3A:
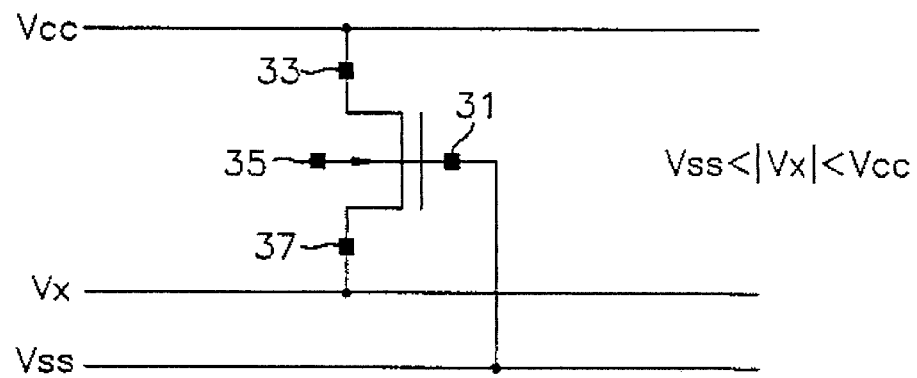
FIG. 3 shows the electrostatic discharge protection device according to another preferred embodiment of the present invention, with FIG. 3(A) showing the equivalent circuit diagram and FIG. 3(B) the vertical sectional diagram.
Figure 3B:
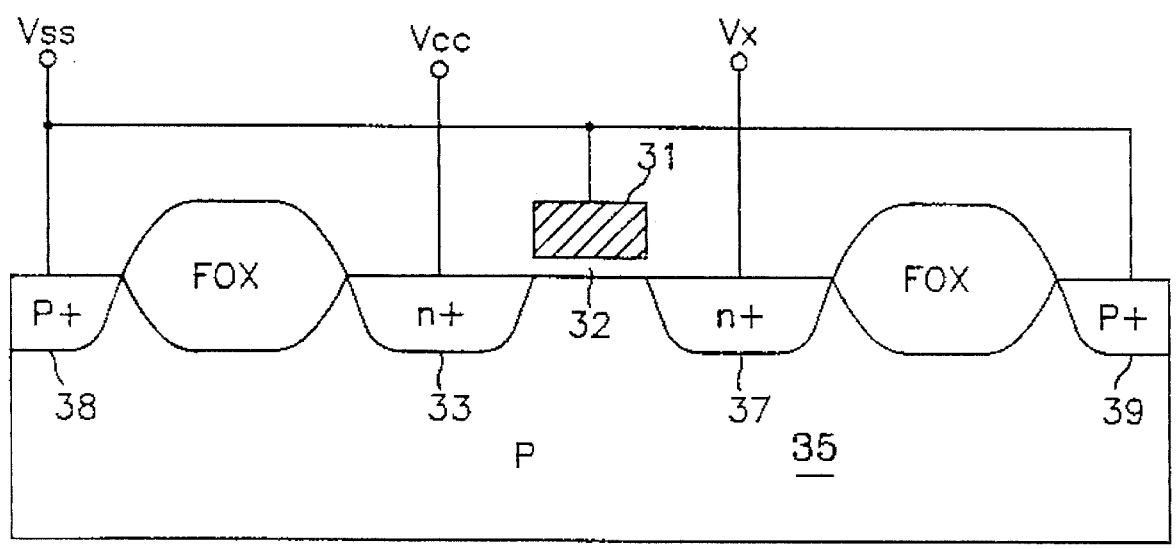

FIG. 2 shows an electrostatic discharge protection device utilizing a P channel dielectric gate effect MOS transistor (hereinafter referred to as a "PMOS transistor") according to the present invention, and FIG. 3 shows the electrostatic discharge protection device utilizing an N channel MOS transistor according to the present invention. The equivalent circuit diagrams as well as the sectional diagrams as shown in FIGS. 2 and 3 will be referred in the following description. For the convenience of understanding, the same components have the same reference numerals in FIGS. 2 and 3.

Referring now to FIG. 2, a gate 21 of the PMOS transistor and a bulk 27 (n type substrate or a well) are commonly connected to a power supply voltage Vcc. A gate oxide film 22 made of dielectric is formed between the gate 21 and bulk region 27. And a source (or a drain) 23 of P+ diffused region is coupled to a signal voltage (an input or output voltage) Vx, and a drain 25 (or a source) of P+ diffused region to a substrate voltage Vss. The potential of the signal voltage Vx is placed between the power supply voltage Vcc and substrate voltage Vss, as shown in FIG. 2. Consequentially, in the electrostatic discharge protection device as shown in FIG. 2, the gate 21 and bulk 27 have the same voltage level as that of the substrate voltage Vss.

Therefore, in the electrostatic discharge operation between the signal voltage Vx and substrate voltage Vss, if a static electricity is transferred into the substrate voltage Vss, the electrostatic current is transferred through a P+/n junction diode (which is forward biased) composed of the P+ diffused region 25 and the bulk region 27 (n type substrate or a well), and then discharged through the n/P+ junction diode composed of the n bulk region 27 and P+ diffused region 23. That is, the electrostatic discharge function is performed by utilizing the operation of the parasitic PNP bipolar transistor composed of the P+ diffused regions 23 and 25 and the n bulk region 27. Thereby, it is possible to achieve an improved electrostatic discharge effect as compared to the conventional device utilizing a simple P+/n junction diode. Since the gate 21 and bulk region 27 are connected to the power supply voltage Vcc, they remain at a floating state during the electrostatic discharge operation.

In the electrostatic discharge operation between the signal voltage Vx and substrate voltage Vss, if the static electricity is transferred into the signal voltage Vx, the electrostatic current is transferred into through the P+/n junction diode (which is forward biased) composed of the P+ diffused region 23 and the n bulk region 27, and then discharged through the n/P+ junction composed of the n bulk region 27 and the P+ diffused region 25. Since the gate 21 is coupled to the power supply voltage Vcc and the voltage between the gate and source is higher than the threshold voltage of the PMOS transistor, the device of FIG. 2 can be operated as the PMOS transistor. Consequentially, the electrostatic current transferred into the signal voltage Vx is discharged through a pull-down circuit having the PMOS transistor and the parasitic PNP bipolar transistor composed of the P+ diffused regions 23 and 25 and bulk region 27, with the PMOS transistor and the parasitic PNP bipolar transistor being connected in parallel between the signal voltage Vx and substrate voltage Vss. Thus, a large amount of electrostatic current can be discharged. As a result, it is possible to achieve an improved effect as compared to the conventional device utilizing the simple P+/n junction diode.

In the electrostatic discharge function between the signal voltage Vx and power supply voltage Vcc, if the static electricity is flown into the signal voltage Vx, the electrostatic current is discharged by the forward bias of the P+/n junction diode composed of the P+ diffused region 23 and n bulk region 27. In addition, if the static electricity is transferred into the power supply voltage Vcc, the electrostatic discharge protection function can be achieved with the junction breakdown occurred by the backward bias of the P+/n junction diode composed of the P+ diffused region 23 and n bulk region 27.

Referring to FIG. 3 showing the device utilizing the NMOS transistor, the gate 31 of the NMOS transistor and the bulk 35 (p type substrate or a well) are connected to the substrate voltage Vss. The gate oxide film 32 made of the dielectric is formed between the gate 31 and bulk region 35. The drain 33 (or a source) of the n+ diffused region is coupled to the power supply voltage Vcc, and the source 37 (or a drain) of the n+ diffused region to the signal voltage Vx (which corresponds to the input or output voltage). Since the power supply voltage Vcc and substrate voltage Vss determine the range of the voltage operated within the semiconductor integrated circuit, the potential of the signal voltage Vx is placed between the power supply voltage Vcc and substrate voltage Vss. In the electrostatic discharge protection device as shown in FIG. 3, the gate 31 and bulk 35 have the same voltage level as that of the substrate voltage Vss, as shown in FIG. 2.

FIG. 3 has the same electrostatic discharge function as the device utilizing the PMOS transistor in FIG. 2, except the polarity of the power supply and the mobility of the carrier are reversed. That is, the characteristic of the parasitic NPN bipolar transistor composed of the n+ type diffused regions 33 and 37 and p type bulk region 35 is utilized between the signal voltage Vx and power supply voltage Vcc, and the characteristic of the p/n+ junction diode composed of the p type bulk region 35 and n+ diffused region 37 is utilized between the signal voltage Vx and substrate voltage Vss. In the embodiment of FIG. 3, the electrostatic discharge function between the signal voltage Vx and power supply voltage Vcc is performed by utilizing the bipolar transistor as shown in FIG. 2, and further, the bipolar and MOS transistors are operated in parallel if the static electricity is transferred into the power supply voltage Vcc, this results in maximizing the electrostatic discharge function. Referring to FIG. 4 showing the result of the test on 64 Mb DRAM, assuming that the channel is 350 μm in width and 0.8 μm in length and the gate oxide film is 120 Å in thickness in FIG. 2 or FIG. 3, if the static electricity of 2000 V is experimentally applied to the substrate voltage Vss, the temperature of the silicon single crystal within the bulk does not exceed at least 130° C. in the case of the human body model. In addition, if the static electricity of 300 V is experimentally applied under the same condition as the above, the temperature of the silicon single crystal within the bulk does not exceed 300° C. in the case of the machine model.

The protection function can be increased by comprising a separate guard ring region (a diffused region of higher density than the bulk) in the construction of the preferred embodiments of the present invention as shown in FIGS. 2 and 3, and the n+ type diffused regions 28 and 29 in FIG. 2 and the P+ type diffused regions 38 and 39 in FIG. 3 can be used as the guard ring region.

As described above, the present invention has the effect of improving the stability of the semiconductor component against static electricity and the reliability accordingly by maximizing and diversifying the protection function of the semiconductor integrated circuit against the static electricity. In addition, as shown in FIGS. 2 and 3, the present invention can realize the reliable electrostatic discharge protection device for respective discharge paths by a single MOS transistor construction, so that it is possible to achieve the electrostatic discharge protection function without increasing the size of the chip.

What is claimed is:

1. A semiconductor device having a first power supply having a first voltage level, a substrate voltage having a substrate voltage level, and a signal voltage having a signal voltage level between said first voltage level and said substrate voltage level, said semiconductor device comprising:
   a substrate of a first conductivity type having a bulk region;
   a first region diffused in said substrate of a second conductivity type opposite said first conductivity type, said first region connected to said substrate voltage;
   a second region of said second conductivity type that is diffused in said substrate and spaced from said first region, said second region connected to said signal voltage;
   an insulator which covers said substrate, said first region and said second region; and
   a gate electrode disposed over said insulator between said first and second regions, said gate electrode connected to said bulk region of said substrate and said first power supply.

2. A semiconductor device according to claim 1 wherein said first voltage level is greater than said substrate voltage level.

3. A semiconductor device according to claim 2 wherein said first power supply is connected to said bulk region of said substrate through a high density diffused region of said first conductivity type.

4. A semiconductor device according to claim 3 further including a field oxide region disposed between said high density diffused region and said second region.

5. A semiconductor device according to claim 1 wherein said first conductivity type is n-type and said second conductivity type is p-type.

6. A semiconductor device according to claim 1 wherein said substrate voltage level is placed between a negative voltage and 0 volts.

7. A semiconductor device having a first power supply having a first voltage level, a substrate voltage having a substrate voltage level, and a signal voltage having a signal voltage level between said first voltage level and said substrate voltage level, said semiconductor device comprising:
   a substrate having a first conductivity type and a bulk region;
   a first region diffused in said substrate of a second conductivity type opposite said first conductivity type, said first region connected to said first power supply;
   a second region of said second conductivity type that is diffused in said substrate and spaced from said first region, said second region connected to said signal voltage;
   an insulator which covers said substrate, said first region and said second region; and
   a gate electrode disposed over said insulator between said first and second regions, said gate electrode connected to said bulk region of said substrate and said substrate voltage.

8. A semiconductor device according to claim 7 wherein said first voltage level is less than said substrate voltage level.

9. A semiconductor device according to claim 8 wherein said substrate voltage is connected to said substrate through a high density diffused region of said first conductivity type.

10. A semiconductor device according to claim 9 further including a field oxide region disposed between said high density diffused region and said first region.

11. A semiconductor device according to claim 1 wherein said first conductivity type is p-type and said second conductivity type is n-type.

12. A semiconductor device according to claim 1 wherein said substrate voltage level is placed between a positive voltage and 0 volts.

* * * * *